United States Patent [19]
Millar

[11] Patent Number: 5,684,404
[45] Date of Patent: Nov. 4, 1997

[54] SYSTEM AND METHOD OF MEASURING A BATTERY LIFETIME

[75] Inventor: Douglas James Millar, Vancouver, Wash.

[73] Assignees: Sharp Microelectronics Technology, Inc., Camas, Wash.; Sharp Kabushiki Kaisha, Osaka, Japan

[21] Appl. No.: 559,999

[22] Filed: Nov. 17, 1995

[51] Int. Cl.$^6$ ............................................. G01N 27/46
[52] U.S. Cl. .................. 324/426; 324/427; 324/433; 340/636; 320/48
[58] Field of Search .................... 324/426, 427, 324/429, 430, 433; 340/636; 320/48, 39, 30

[56] References Cited

U.S. PATENT DOCUMENTS

| | | | |
|---|---|---|---|
| 4,583,034 | 4/1986 | Martin | 320/21 |
| 4,660,027 | 4/1987 | Davis | 340/691 |
| 4,929,931 | 5/1990 | McCuen | 340/636 |
| 4,947,123 | 8/1990 | Minezawa | 324/427 |
| 5,130,659 | 7/1992 | Sloan | 324/427 X |
| 5,140,310 | 8/1992 | DeLuca et al. | 340/636 |
| 5,155,428 | 10/1992 | Kang | 320/13 |
| 5,166,623 | 11/1992 | Ganio | 324/427 |
| 5,239,286 | 8/1993 | Komatsuda | 340/636 |
| 5,371,682 | 12/1994 | Levine et al. | 324/426 X |
| 5,424,722 | 6/1995 | Inada et al. | 340/636 |

*Primary Examiner*—Ernest F. Karlsen
*Assistant Examiner*—Diep Do
*Attorney, Agent, or Firm*—Gerald W. Maliszewski; David C. Ripma

[57] ABSTRACT

A voltage gradient measurement device is provided for determining the remaining lifetime of a battery used to power a radio, pager, cellular telephone, or similar device. The battery is attached to a first circuit element to obtain a history of the battery voltage which is used to determine the differential battery voltage. The battery is also attached to a second circuit element which measures the voltage margin between the battery voltage and a reference voltage representing the battery end-of-life condition. A third circuit element divides the voltage margin output of the second circuit element by the differential battery voltage output of the first circuit element to estimate the time that will elapse until the battery voltage approximately equals the reference end-of-life voltage level. This time estimate is used as a basis for performing a variety of functions, including a trigger for a battery shut-off switch to protect radio circuits, and as an activator of indicators to warn the battery user of approaching battery safety thresholds. A method of estimating the remaining useful life of the battery is also disclosed.

20 Claims, 2 Drawing Sheets

SYSTEM AND METHOD OF MEASURING A BATTERY LIFETIME

BACKGROUND AND SUMMARY OF THE INVENTION

This invention relates generally to battery operated wireless communications devices, and more particularly to a system of determining the life of a battery based on measurement of battery voltage gradient.

An important characteristic of wireless communication devices including radios, radio transceivers, radio telephones, cellular telephones, pagers, or the like, is their small size and portability. These radio devices use batteries as a power source. Wireless communications devices are typically designed to work with a battery having a voltage within a specified range of voltages. Voltages that exceed the maximum specified value can destroy components in the radio device. Voltages that fall below the minimum threshold cause active components to cease operating within specification, or to not function at all. Some wireless devices disconnect the battery from the wireless load circuits to protect circuitry from too low a voltage. A battery voltage that is low, but above minimum threshold, may be inadequate to supply current for high current functions such as transmission. Therefore, wireless devices will not operate with a discharged battery, and effective use of these devices is limited when the battery voltage is low. Wireless communications that are begun with a low battery voltage are susceptible to interruption as the battery current and radiated transmitter power decrease. Wireless communications begun with a battery near its end-of-life voltage state will degrade into a state of total interruption or termination.

When size is a predominate concern the radio device must be powered with a small battery. Concern over the lifetime of small batteries is even more critical. Small batteries have a more limited lifetime and are liable to perform more erratically towards the end of their lifetime. It is inconvenient to arbitrarily change batteries though; batteries can be expensive, and spares difficult to carry. As a result, users must balance concerns of efficient battery use against reliable communication links. Some devices, such as a pager, will operate for an extended period of time with a low voltage battery because of their low current draw. Battery lifetime is even a concern with low power devices since a thrifty user will seek to use a low voltage battery until it reaches its end-of-life condition.

The comparison of the battery voltage against a minimum or maximum reference provides an indication of the battery capacity and allows the user to indirectly calculate the potential lifetime of the battery. Prior art battery condition detection systems that only measure battery voltage are well known.

Kang, U.S. Pat. No. 5,155,428, discloses a battery condition detection device which measures the battery voltage. The battery voltage is compared to a reference voltage representing an end-of-life state. Depending on the results of the voltage comparison, a low voltage measurement causes, either an alarm to sound, or the battery to disconnect from the load.

Deluca, et al., U.S. Pat. No. 5,140,310, discloses a battery condition detection device which reads the battery voltage. The battery voltage measurements are compared to reference voltages that represent various battery conditions to activate a series of indicators which attract the attention of the user to a worsening battery condition.

Davis, U.S. Pat. No. 4,660,027, discloses a battery condition detection device which measures the battery voltage. The measured battery voltage is compared to voltage references representing various battery end-of-life conditions. The battery detector creates a low power alarm signal that is useful in alerting the battery user in a manner that conserves battery power.

Martin, U.S. Pat. No. 4,583,034, discloses a battery condition detector which measures the load current to calculate the battery voltage. The calculated voltage is compared to a reference voltage to determine the condition of the battery. Determination of battery condition permits the device to control the battery shut-off switch, and to regulate the battery charger.

The measurement of the instantaneous, or present, battery voltage does not allow a user to take into account the various other factors, however, such as age, type, and capacity which affect battery lifetime. The use of the instantaneous battery voltage as the sole indicator of lifetime, therefore, results in inaccuracies.

Battery lifetime is dependent on the battery size or initial charge capacity. A large battery, one that changes voltage very slowly as current is drawn, will have a longer lifetime than a small battery. The battery type or technology is also an important factor in lifetime since different types of batteries have different capacities. For example, alkaline and nickel-cadmium have different capacities and discharge characteristics. The age and general condition of the battery is important factor in determining capacity since a new, or well maintained, battery will hold its charge better.

It would be advantageous if a battery condition detector based its calculation of expected battery lifetime on additional data, beyond simply the use of an instantaneous battery voltage measurement. The instantaneous battery voltage measurement gives the user no indication of the capacity of the battery whether related to size, type, or general battery condition. It is often difficult to determine this addition data and inconvenient to enter this data into the battery condition detector. The measurement of voltage over a period of time is a better indicator of battery condition since it permits the measurement of the battery capacity with the use of instantaneous battery measurements. Battery measurements taken over a period time, to provide a record of the change in battery voltage, account for the battery capacity and yield a more accurate prediction of the battery lifetime.

It would also be advantageous if battery voltages were measured over a period of time to permit the calculation of the battery voltage rate of change. The rate of change data yielding a record of past performance which could be extrapolated into the future to provide a more accurate prediction of the performance of the battery.

It would be advantageous if the battery condition detector had a comparator to compare the expected future performance of the battery against a lifetime threshold to sound an alarm to warn the user of an impending battery threshold state.

It would also be advantageous if the battery detector used the rate of change generated by the history of voltage measurements to calculate the expected time to reach a minimum battery threshold, and trigger an automatic shutdown switch.

Accordingly, a method of determining a battery condition has been provided which comprises a first step of determining the rate of change in the battery voltage. A second step of comparing a battery voltage measurement against a first predetermined voltage to provide a first voltage margin which is proportional to the difference between the measured battery voltage and the first predetermined voltage. A third step of dividing the first voltage margin by the voltage rate of change to provide a first battery condition measurement of time which is proportional to the time remaining until the measured battery voltage approximately equals the first predetermined voltage, whereby the remaining useful life of the battery is determined.

In its preferred form, the time remaining until the battery reaches the first predetermined, or first end-of-life, voltage can be compared against a time threshold to sound an alarm. For example, the alarm can be set to trigger 5 minutes before the battery is expected to reach its first end-of-life threshold. Likewise, the first battery condition can be displayed on an indicator to warn the user of the time remaining until the alarm sounds or until the battery voltage approximately equals the first end-of-life voltage.

In a preferred embodiment of the present invention, an Analog to Digital Converter is used to make measurements of the battery voltage and to convert the results into a digital format. The digitally formatted battery voltage data can be used to represent the instantaneous battery voltage, and may also be stored for future use in the registers of memory devices.

The battery detector of the present invention may preferably be used to trigger a switch to disconnect the battery from its load. The battery voltage is compared against a second end-of-life voltage to yield a second voltage margin. The second voltage margin is used to activate the switch which disconnects the load from the battery when the battery voltage approximately equals the second end-of-life voltage. The second voltage margin is divided by the rate of change, obtained in the method above, to provide a second battery condition time measurement. This second battery condition is proportional to the time remaining until the battery voltage reaches the second end-of-life voltage when the switch disconnects the load from the battery. The estimated time remaining until the switch is activated is displayed on an indicator to warn the user.

BRIEF DESCRIPTION OF THE DRAWINGS

FIG. 4 is a digitized embodiment battery detector of FIG. 1 including additional elements to employ a battery voltage rate of change gradient.

DETAILED DESCRIPTION OF THE PREFERRED EMBODIMENT

Figure 1:
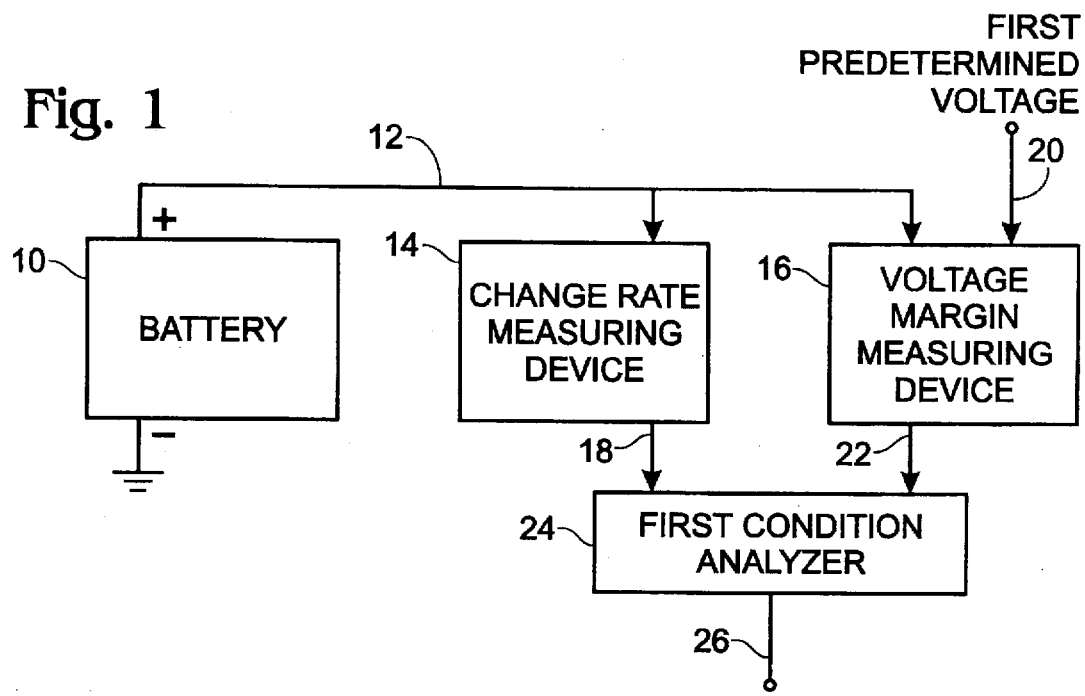
FIG. 1 is a block diagram of a voltage gradient battery detector in accordance with the present invention.

FIG. 1 illustrates a block diagram of a voltage gradient battery detector in accordance with the present invention. A battery 10, for example, the type used in a cellular telephone, mobile telephone, or pager, provides an output voltage on line 12 which is monitored to determine the battery condition. Line 12 is operatively connected to the input of a change rate measuring device 14, and also to the input of a voltage margin measuring device 16. Change rate measuring device 14 measures the voltage on line 12 at predetermined time intervals to determine a voltage rate of change, which is the change in the voltage over time. The voltage rate of change is proportional to the difference between the battery voltage measurements taken at different times. The time intervals are repeatable, meaning that the clock used to determine the intervals is accurate within a predetermined margin of error. The time interval is also selectable, meaning that the time interval need not remain constant. For example, the time rate may be changed from ten seconds to five seconds when a higher update rate and greater accuracy is desired by the user. Alternately, although regular time intervals permit a simpler calculation of voltage rate of change, irregular time intervals may be used between every voltage measurement to allow a microprocessor to service higher priority routines. Change rate measuring device 14 outputs the battery voltage change rate on line 18.

Voltage margin measuring device 16 measures the battery voltage on line 12 at any selected time and compares this voltage against a reference, or first predetermined, voltage provided on line 20. The source of the reference voltage, not shown, can be a battery, the voltage drop across a diode, a digitally formatted reference stored in memory, or the like. The output of voltage margin measuring device 16, line 22, is a signal which is proportional to the difference between the voltages on lines 12 and 20, and is called the first voltage margin.

A first condition analyzer 24 compares the voltage change rate on line 18 against the first voltage margin on line 22. First condition analyzer 24 uses the change rate to estimate the time that will be required for the voltage margin to approximately equal zero. This time measurement, called the first battery condition, is output from first condition analyzer 24 on line 26. The first battery condition is proportional to the time remaining until the battery voltage on line 12 approximately equals the first voltage on line 20.

Figure 2:
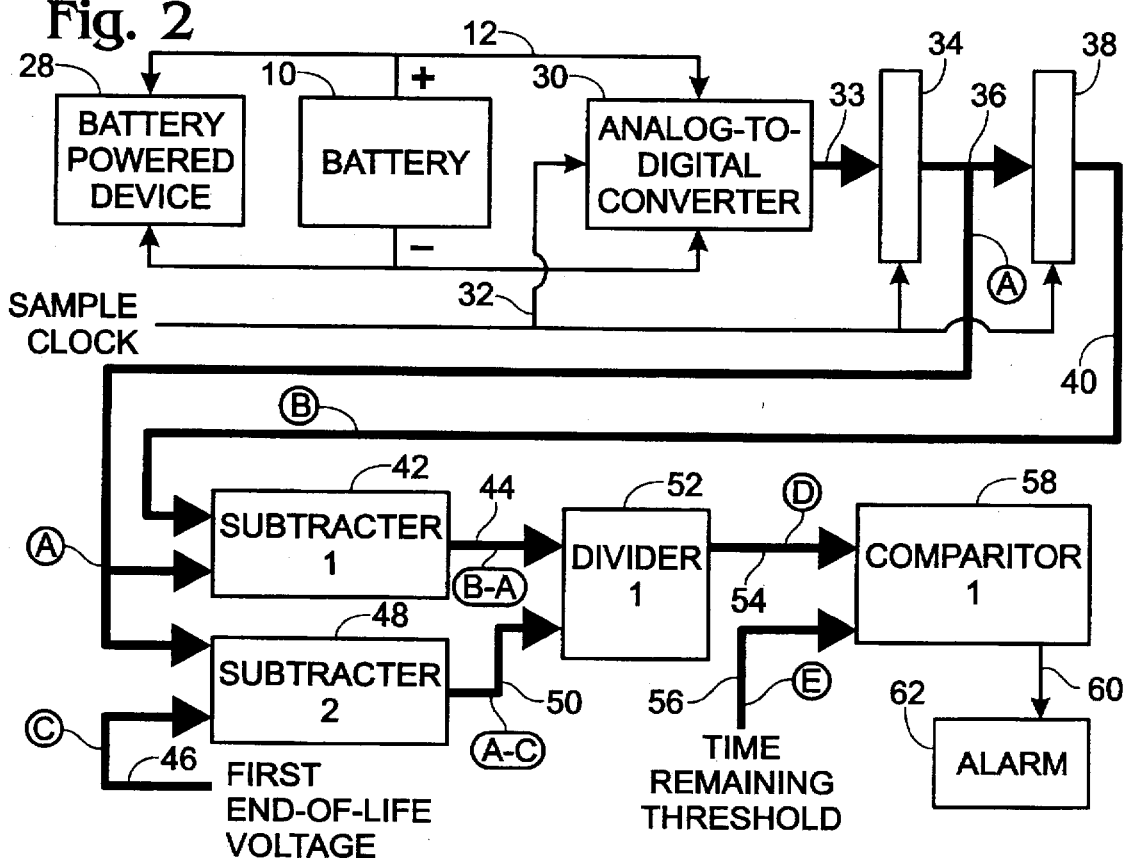
FIG. 2 is a digitized embodiment of the battery detector of FIG. 1 with an alarm indicator.
Figure 3:
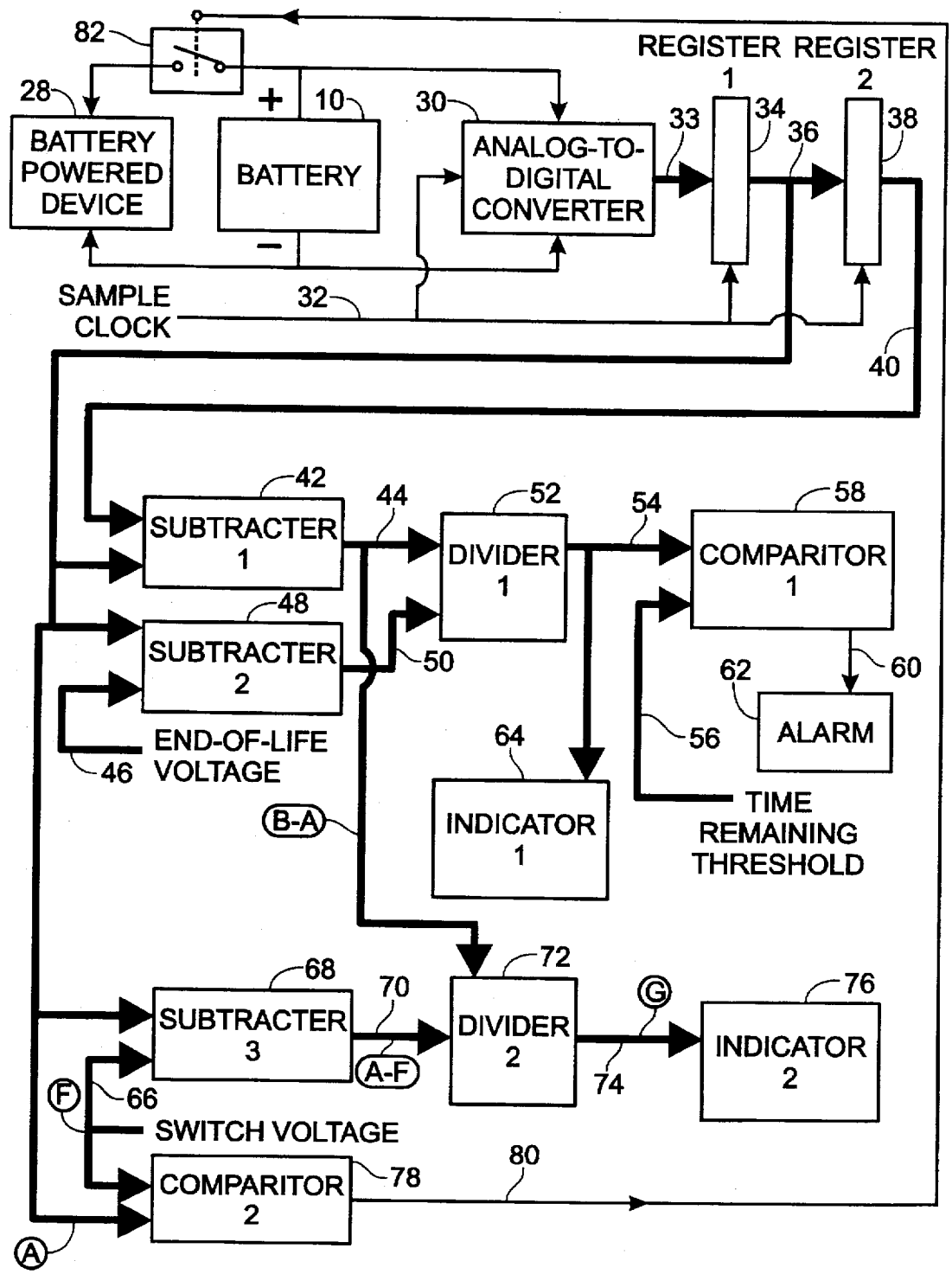
FIG. 3 is a digitized embodiment of the battery detector of FIG. 1, including an additional indicator and battery disconnect switch.

FIG. 2 is a digitized embodiment of the voltage gradient battery detector of FIG. 1, including an alarm indicator. Battery 10 is operatively connected to a battery powered device, or load, 28. To simplify the drawings a similar load is omitted from FIG. 1. The battery voltage on line 12 is operatively connected to an Analog to Digital Converter 30. Analog to Digital Converter, also referred to herein as A/D 30, is used to measure the voltage on battery voltage output line 12. The battery voltage measurements are made at a rate determined by a clock, not shown, which supplies clock signals or pulses, representing a time interval or period, on line 32. The battery voltage on line 12 is sampled by A/D 30 and translated into a digital format. The digitized battery voltage data is shifted via a bus line 33 to a first register 34. Bus 33 may be either a serial or parallel data bus, and is represented in FIG. 2 with a wide heavy line. It is understood that all other such lines in FIGS. 2–3 are also data bus lines. The digitally formatted battery voltage is shifted into first register 34 at the clock rate present on line 32. Line 36 operatively connects the output of first register 34 to a second register 38 to shift the first measured voltage. The first measured voltage is a digitized representation of a voltage value proportional to the voltage on line 12. The first measured voltage is also referred to herein as A. The first voltage is shifted into second register 38 at the clock rate present on line 32.

A second measured voltage is output from second register 38 on line 40. The digitized voltage represented by the data on line 40 shall also be referred to herein as B. The second measured voltage is the first measured voltage of the previous clock period. That is, the first measured voltage, A, referenced to a first clock pulse, becomes the second measured voltage, B, during a second clock pulse. In this manner, the instantaneous battery voltage on line 12 is stepped sequentially to lines 33, 36, and 40, in a digital format, and at a rate determined by the clock pulses present on line 32.

The first measured voltage on line 36 and second measured voltage on line 40 are supplied to a first subtractor circuit 42. First subtractor circuit 42 determines the difference between A and B, that is, the difference between the digitally represented voltage values stored in first register 34 and second register 38. The difference between A and B is the battery voltage change rate and is output in a digital format on line 44, which is the same as line 18 in FIG. 1. The battery voltage rate of change is alternately referred to herein as the battery voltage gradient, or (B−A). The difference between the first measured voltage and second measured voltage is calculated at the interval determined by the pulse present on line 32. A/D 30, first register 34, second register 38, and first subtractor 42 comprises elements of change rate measuring device 14 depicted in FIG. 1.

The first end-of-life, or first predetermined, voltage is represented in digital form on line 46. The first voltage is input on line 46, along with the first measured voltage on line 36, into a second subtractor circuit 48. Line 46 is the same as line 20 in FIG. 1. The voltage digitally represented on line 46 is alternately referred to herein as the first end-of-life condition, or C. Second subtractor circuit 48 determines the difference between digitally represented voltages A and C, and outputs the first voltage margin, in a digital format on line 50, which is proportional to the difference between voltages A and C. Line 50 is the same as line 22 in FIG. 1. The first voltage margin is alternately referred to herein as (A−C). Second subtractor 48 comprises voltage margin measuring device 16 depicted in FIG. 1.

A first divider circuit 52 accepts the first voltage margin on line 50 and the battery voltage rate of change on line 44 as inputs. First divider circuit 52 divides the first voltage margin by the rate of change to yield a first battery condition, D, in a digital format on line 54. Line 54 is the same as line 26 in FIG. 1. The first battery condition is a measurement of time proportional to the time remaining until voltage A approximately equals voltage C. First divider circuit 52 comprises first condition analyzer 24 depicted in FIG. 1. The first condition is calculated by the following formula.

$$D=(A-C)/(B-A); \text{ or} \qquad (1)$$

$$\Delta t = \Delta v_2/(d(v_1)/d(t_1))$$

Where:

$\Delta v_2 = (A-C)$ $d(v_1)/d(t_1)=(B-A)$; over the time interval between the measurement of A and B which is $d(t_1)$ The first battery condition on line 54 is supplied, with a time remaining threshold, or a first predetermined time interval, on line 56 to a first comparator 58. The first time interval represents a measurement of time in digital form, and is referred to herein as E. First comparator 58 compares first battery condition, D, with first time interval, E, to yield a first time margin, or an alarm enable signal, on line 60 that is proportional to the difference between the first battery condition and the first time interval. An alarm indicator 62 is activated when time D approximately equals time E, that is, when the first time margin approximately equals zero. In this manner, the battery user is warned of the estimated time remaining until first measured voltage, A, approximately equals first voltage, C. The phrase "approximately equal", as used herein, refers to the equivalency of analog values within a predetermined margin, whether represented in digital format or not.

FIG. 3 is another digitized embodiment of a voltage gradient battery detector as depicted in FIG. 1, with an additional indicator and switch. The first battery condition on line 54 is operatively connected to a first indicator 64 to selectively display the time remaining until the first measured voltage, A, approximately equals the first voltage, C.

A second predetermined voltage, or switch voltage, on line 66 is supplied, along with the first measured battery voltage on line 36 to a third subtractor circuit 68. The voltage represented in digital format on line 66 is also referred to herein as the second end-of-life condition, or F. Second subtractor circuit 68 subtracts second voltage, F, from first measured voltage, A. The difference between the digitally represented voltages A and F is the second voltage margin, represented in digital form on line 70. The second voltage margin is a voltage measurement proportional to the difference between first measured voltage A and second voltage F and is alternately referred to herein as (A−F).

A second divider circuit 72 accepts the second voltage margin on line 70 and the battery voltage rate of change on 44 as inputs. Second divider 72 divides the second voltage margin by the battery voltage rate of change to obtain a second battery condition. The second battery condition is a measure of time proportional to the time remaining until first measured voltage, A, approximately equals second voltage, F, and is represented in digital form on line 74. The second battery condition is alternately referred to herein as G. Therefore, the first battery condition is associated with an early warning to the user that the battery voltage is approaching a critical threshold, while the second condition is related to a later warning, or a warning of the approach of an even more critical second threshold.

The second battery condition is calculated according to the following formula.

$$G=(A-F)/(B-A); \text{ or} \qquad (2)$$

$$\Delta t = \Delta v_3/(d(v_1)/d(t_1))$$

Where:

$\Delta v_3 = (A-F)$

The second battery condition on line 74 is supplied to a second indicator 76 to selectively display the time remaining until first measured voltage, A, approximately equals second voltage, F.

A second comparator circuit 78 accepts the second voltage on line 66 and the first measured voltage on line 36 as inputs. Second comparator 78 compares first measured voltage, A, to second voltage, F. When A approximately equals F, second comparator 78 creates a switch trigger enable signal on line 80. The enable signal on line 80 triggers a switch 82. Switch 82 is normally closed and operatively connects battery 10 to load 28. When triggered by the enable signal on line 80, switch 82 changes to the open position to operatively disconnect load 28 from battery 10, whereby the load is protected from abnormal voltage levels and the battery is protected from discharge.

Alternately, the second voltage margin on line 70 is supplied to switch 82, in addition to second divider 72, as described above. In this manner, the first measured voltage, A, and the second voltage, F, are compared to provide a second voltage margin signal that is used to enable switch 82, causing switch 82 to trigger when the second voltage margin approximately equals zero. The use of the second voltage margin to enable switch 82 permits second comparator 78 and line 70 to be eliminated.

The present invention represents an advantage over prior art devices, which are only able to make a determination of battery lifetime based on an instantaneous battery voltage measurement. The present invention uses a history of battery voltage measurements to develop, or calculate, a higher order prediction of battery behavior. This prediction of battery behavior, representing the battery voltage rate of change, can be carried forward to determine the future potential of the battery and, thus, to indicate its future lifetime. The battery voltage rate of change allows the battery lifetime estimate to be based on the experience of the specific battery currently in operation, and the actual battery capacity. In this manner, differences between battery sizes, battery types, and the individual performance of selected batteries will be automatically factored into the battery life predictions, providing a more accurate determination of future battery life. Likewise, this method of measuring battery voltage permits variables such a temperature, and mode of telephone operation, to be more accurately factored into a determination of battery lifetime.

The present invention, as described in FIG. 1, is either an analog or digital device. Although FIGS. 2-3 describe a battery detector using aspects of digital storage and computation, the various measurements of voltage, rate of change, and time may alternately be represented by analog voltages which are stored, transferred, and manipulated in mathematical calculations as is well known in the art.

The present invention is not limited to the use of constant interval sample clock rates. The present invention may alternately use a variable clock rate. A variable clock rate is desirable when the battery voltage detector is also associated with a microprocessor device that must service other functions with higher priorities. For example, a microprocessor may create a first clock period of 1 second, a second period of 1.2 seconds, and a third period of 0.8 seconds in the event that the microprocessor must sample the battery voltage in between other, more critical, functions. Likewise, different and varying clock rates are acceptable in determining the battery voltage rate of change and battery voltage rate of change gradient.

The present invention is not exclusively represented by the elements as recited above, and depicted in FIGS. 1-3. The present invention can be realized through the use of a variety of hardware circuits and software routines. For example, subtractor, comparator, and divider circuits are realizable with hardware devices to process the various measurements as analog voltages. Also, duplicate elements are replaceable with a single element. For example, multiple subtractor circuits, are replaceable with a single subtractor circuit multiplexed to handle all the various subtraction operations at different times. Further, the different subtraction, comparison, and division operations, listed in the specification above, are realizable through fie use of a microprocessor and software coded to operate the microprocessor.

The present invention may be used to measure more than first or second battery conditions. For example, the present invention may alternately be configured to determine various other battery conditions derived from information such as the instantaneous voltage, the voltage rate of change, and the voltage rate of change gradient measurements. An understanding of battery characteristics that make use of the measurement of the battery rate of change in conjunction with the instantaneous voltage and the rate of change gradient may be taken advantage of with the present invention by the addition of further processes, or mathematical calculations, that rely on the instantaneous voltage, and the first or second battery conditions as inputs. In this manner, battery lifetime calculations may more accurately account for variables in the use of a battery, giving the user a variety of potential measurements such as lifetime based on average battery use, lifetime based on short term use, or lifetime based on use in a particular mode of operation, such as transmit as opposed to receive.

Nor is the battery condition detector concept of the present invention necessarily limited to cellular telephone and radio devices, although it is particularly advantageous for such use because of the concern shared by users over reliable communication links and the thrifty use of batteries. The concept is applicable to all devices operated by batteries where it is important for the user to know the time remaining before the battery reaches its end-of-life condition.

What is claimed is:

1. A method for determining the time remaining until a battery reaches a first predetermined voltage reference, which represents a first end-of-life voltage, comprising the steps of:

a) measuring the instantaneous battery voltage at predetermined time intervals to determine a rate of change in the battery voltage;

b) measuring the instantaneous battery voltage and comparing the instantaneous battery voltage measurement against the first voltage reference to provide a first voltage margin which is a voltage proportional to the difference between the instantaneous battery voltage measurement and the first voltage reference; and c) dividing the first voltage margin obtained in step b) by the voltage rate of change obtained in step a) to provide a first battery condition, which is a period of time proportional to the time remaining until the instantaneous battery voltage measured in step b) approximately equals the first voltage reference, whereby the remaining useful life of the battery is determined.

2. A method for determining the time remaining until a battery reaches an end-of-life voltage as in claim 1, wherein a first predetermined time interval, which is a time remaining threshold, is provided, and including the steps of:

d) comparing the period of time represented by the first battery condition obtained in step c) against the first time interval to provide a first time margin which is a period of time proportional to the difference between the first battery condition and the first time interval, whereby the time for reaching the threshold is determined; and e) activating an alarm indicator when the first time margin provided in step d) approximately equals zero, whereby the alarm warns the user of a battery life approximately equal to the threshold established by the first time interval.

3. A method for determining the time remaining until a battery reaches an end-of-life voltage as in claim 2, wherein a first indicator is provided, and including the step of:

f) selectively displaying the period of time represented by the first battery condition on the first indicator, whereby a user can read the time remaining until the instantaneous battery voltage measured in step b) approximately equals the first voltage reference.

4. A method for determining the time remaining until a battery reaches an end-of-life voltage as in claim 3, wherein the battery is operatively connected to a load through a switch, and wherein a second predetermined voltage reference, which is a second end-of-life voltage, is provided, the method further including the steps of:

g) comparing the instantaneous battery voltage measured in step b) against the second voltage reference to provide a second voltage margin which is a voltage proportional to the difference between the instantaneous battery voltage measurement and the second voltage reference; and h) opening the switch to operatively disconnect the load from the battery when the second voltage margin approximately equals zero, whereby the switch serves to protect the load from voltages outside the limits prescribed by the second voltage reference.

5. A method for determining the time remaining until a battery reaches an end-of-life voltage as in claim 4, wherein a second indicator is provided, and including the steps of i) dividing the second voltage margin obtained in step g) by the battery voltage rate of change obtained in step a) to provide a second battery condition which is a period of time proportional to the time remaining until the instantaneous battery voltage measured in step b) approximately equals the second voltage reference; and j) selectively displaying the period of time represented by the second battery condition obtained in step i) on the second indicator, whereby the second indicator warns the user of the time remaining until the instantaneous battery voltage measured in step b) approximately equals the second voltage reference.

6. A method for determining the time remaining until a battery reaches an end-of-life voltage as in claim 1, wherein a memory device is provided, and in which the determination of the battery voltage rate of change obtained in step a) includes the further step of storing at least one instantaneous battery voltage in the memory device for retrieval.

7. A method for determining the time remaining until a battery reaches an end-of-life voltage as in claim 6, in which step a) includes using two instantaneous battery voltage measurements, measured at different times, to determine the battery voltage rate of change.

8. A method for determining the time remaining until a battery reaches an end-of-life voltage as in claim 7, in which step a) includes determining the battery voltage rate of change from the instantaneous battery voltage measurements made in step b).

9. A method for determining the time remaining until a battery reaches an end-of-life voltage as in claim 8, wherein an Analog to Digital Converter is provided, and including the step of using the Analog to Digital Converter to convert an instantaneous battery voltage measurement into a digital format.

10. A method for determining the time remaining until a battery reaches an end-of-life voltage as in claim 9, wherein a clock having a selectable predetermined repeatable time interval is provided, and in which step a) includes making instantaneous battery voltage measurements with the Analog to Digital Converter at a time interval provided by the clock to determine the battery voltage rate of change.

11. A detector for measuring the lifetime remaining until a battery reaches a first predetermined voltage reference which represents a first end-of-life battery voltage, comprising:

a voltage measuring device selectively connected to the battery for measuring a first battery voltage, which is an instantaneous battery voltage;

a first subtractor circuit responsive to said voltage measuring device for measuring the difference between at least two instantaneous battery voltage measurements, made at a predetermined time interval by said voltage measuring device, to provide a voltage change rate which is proportional to the difference between the instantaneous battery voltage measurements;

a second subtractor circuit responsive to said voltage measuring device and the first voltage reference, for measuring the difference between the first battery voltage and the first voltage reference, and providing a first voltage margin which is a voltage proportional to the difference between the first battery voltage and the first voltage reference; and a first divider circuit responsive to said first and second subtractor circuits to divide the first voltage margin by the voltage change rate to provide a first battery condition, which is a period of time proportional to the time remaining until the first battery voltage approximately equals the first voltage reference, thereby determining the remaining useful life of the battery.

12. A detector for measuring the lifetime remaining in a battery as in claim 11, inducting a memory device containing a battery voltage history operatively connected to said first subtractor circuit, and in which at least one second battery voltage, which is an instantaneous battery voltage measurement retrieved from said memory, is used as an input to said first subtractor circuit.

13. A detector for measuring the lifetime remaining in a battery as in claim 12, including a clock operatively connected to said voltage measuring device to provide selectable predetermined repeatable time intervals, whereby first battery voltage measurements are made at selectable predetermined repeatable time intervals.

14. A detector for measuring the lifetime remaining in a battery as in claim 13, in which the first battery voltage measurement is input to both said subtractor circuits.

15. A detector for measuring the lifetime remaining in a battery as in claim 14, wherein a first predetermined time interval, which is a time remaining threshold, is provided, and comprising;

a first comparator responsive to said first subtractor circuit and the first time interval to measure the difference in time between the first battery condition and the first time interval, and to provide a first time margin which is a period of time proportional to the difference between the first battery condition and the first time interval; and an alarm responsive to said first comparator, and activated when the first time margin approximately equals zero, whereby said alarm serves to warn the user of a battery life approximately equal to the first time interval.

16. A detector for measuring the lifetime remaining in a battery as in claim 15, including a first indicator, and in which the first battery condition time measurement is selectively displayed on said first indicator, whereby the remaining useful life of a battery is indicated.

17. A detector for measuring the lifetime remaining in a battery as in claim 16, wherein a second predetermined voltage reference, which represents a second end-of-life voltage, is provided, and comprising:

a load operatively connected to the battery;

a switch operatively connecting said load to the battery in the closed position and operatively disconnecting said load from the battery in the open position; and a second comparator responsive to said voltage measuring device and the second voltage reference to measure the difference between the first battery voltage and the second voltage reference, the output of said second comparator being operatively connected to said switch to trigger said switch to change from the closed to the open position when the first battery voltage approximately equals the second voltage reference, whereby the switch serves to protect said load from battery voltages outside the range prescribed by the second voltage reference.

18. A detector for measuring the lifetime remaining in a battery as in claim 17, comprising:

a third subtractor circuit responsive to said voltage measuring device and the second voltage reference, to measure the difference between the first battery voltage and the second voltage reference, and to provide a second voltage margin which is a voltage proportional to the difference between the first battery voltage and the second voltage reference;

a second divider circuit responsive to said third subtractor circuit and said first subtractor circuit for dividing the second voltage margin by the voltage change rate, and to provide a second battery condition, which is a period of time proportional to the time remaining until the first battery voltage approximately equals the second voltage reference; and a second indicator operatively connected to said second divider circuit to selectively display the period of time represented by the second battery condition, whereby said second indicator serves to warn the user of the time remaining until the first battery voltage approximately equals the second voltage reference.

19. A detector for measuring the lifetime remaining in a battery as in claim 14, in which said voltage measuring device is an Analog to Digital Converter to convert analog first battery voltage measurements into digitally formatted data representing the analog voltages at a time interval provided by said clock.

20. A detector for measuring the lifetime remaining until a battery reaches a first predetermined voltage reference, which represents a first end-of-life battery voltage, and comprising:

a first comparator having inputs operatively connected to the battery and the first voltage reference to measure the difference between an instantaneous battery voltage and the first voltage reference, said first comparator providing a first voltage margin which is a voltage proportional to the difference between the instantaneous battery voltage and the first voltage reference;

a voltage gradient measuring device operatively connected to the battery and to a clock pulse having a predetermined time interval, to measure the change in the instantaneous battery voltage with respect to an interval of time, said voltage gradient measuring device providing a voltage gradient, which is the battery voltage rate of change; and a first condition analyzer operatively connected to said first comparator and said voltage gradient measuring device for dividing the first voltage margin by the voltage gradient, and to output a first battery condition, which is a period of time proportional to the time remaining until the instantaneous battery voltage approximately equals the first voltage reference, whereby the remaining useful life of the battery is determined.

* * * * *